United States Patent
Heminger et al.

(10) Patent No.: US 6,915,080 B2
(45) Date of Patent: Jul. 5, 2005

(54) METHOD AND APPARATUS FOR ALIGNING OPTICAL WIRELESS LINKS

(76) Inventors: Mark David Heminger, 102 N. River Ct. NE., Rochester, MN (US) 55906; Eric Gregory Oettinger, 532 5th St. SW., Rochester, MN (US) 55902; Mark David Hagen, 1781 Bear Ridge La. SE., Rochester, MN (US) 55904; Karl Kirk Northrup, 409 41st Ave. NW., Rochester, MN (US) 55901

( * ) Notice: Subject to any disclaimer, the term of this patent is extended or adjusted under 35 U.S.C. 154(b) by 581 days.

(21) Appl. No.: 09/940,763

(22) Filed: Aug. 27, 2001

(65) Prior Publication Data

US 2002/0054411 A1 May 9, 2002

Related U.S. Application Data

(60) Provisional application No. 60/285,461, filed on Apr. 20, 2001.

(51) Int. Cl.[7] .............................................. H04B 10/00
(52) U.S. Cl. ........................................ 398/129; 398/121
(58) Field of Search ................................. 398/118–131

(56) References Cited

U.S. PATENT DOCUMENTS 5,592,320 A * 1/1997 Wissinger .................. 398/121
6,181,450 B1 1/2001 Dishman et al.
6,285,481 B1 9/2001 Palmer
6,381,055 B1 * 4/2002 Javitt et al. ................ 398/131

* cited by examiner

Primary Examiner—Agustin Bello
(74) Attorney, Agent, or Firm—William B. Kempler; W. James Brady, III; Frederick J. Telecky, Jr.

(57) ABSTRACT

Optical wireless links automatically align themselves using feedback information that is transmitted over the light beams being aligned. Each link performs an acquisition routine in which its light beam is swept through a pre-defined pattern while transmitting its beam alignment information. When a link receives beam alignment information from a remote link, it updates its transmission to include the alignment information received from the remote link. At some point during the acquisition routine, the remote link will receive its own alignment information "echoed back" from the first link and will re-align its beam accordingly. At some point, each link will have received its own alignment information echoed back from the other link and will have aligned itself to that position. Data communication can begin at that point, or a more refined alignment step can then be performed. The alignment information can be based upon position, sample number, or time transmitted.

26 Claims, 4 Drawing Sheets

| LENGTH | DESCRIPTION | |
|---|---|---|
| 6B | MY PHYSICAL ADDR | 74 |
| 6B | YOUR PHYSICAL ADDR | 76 |
| 2B | CONTROL | 78 |
| 2B | STATUS | 80 |
| 2B | SAMPLE # | 82 |
| 2B | LAST SAMPLE SEEN | 84 |
| 2B | TIME STAMP | 86 |
| 2B | MY X (COMMANDED POSITION) | 88 |
| 2B | MY Y (COMMANDED POSITION) | 90 |
| 2B | YOUR X (COMMANDED POSITION) | 92 |
| 2B | YOUR Y (COMMANDED POSITION) | 94 |
| 2B | QUAD POSITION X | 96 |
| 2B | QUAD POSITION Y | 98 |
| 2B | QUAD SUM X | 100 |
| 2B | QUAD SUM Y | 102 |

METHOD AND APPARATUS FOR ALIGNING OPTICAL WIRELESS LINKS

CROSS REFERENCE TO RELATED APPLICATION

This Application claims benefit of U.S. Provisional Application No. 60/285,461 filed on Apr. 20, 2001 and entitled "Method and Apparatus for Aligning Optical Wireless Link," which provisional application is hereby incorporated by reference.

The following co-pending, co-assigned patent applications are related to the present invention. Each of the applications is incorporated herein by reference.

| Ser. No. | Filing Date | Attorney Docket |
|---|---|---|
| 09/621,385 | Jul. 21, 2000 | TI-30713 |
| 09/620,943 | Jul. 21, 2000 | TI-30714 |
| 60/234,074 | Sep. 20, 2000 | TI-31437 |
| 60/234,086 | Sep. 20, 2000 | TI-31436 |
| 60/234,081 | Sep. 20, 2000 | TI-31444 |
| 60/233,851 | Sep. 20, 2000 | TI-31612 |
| 60/271,936 | Feb. 26, 2001 | TI-32675 |
| 09/839,690 | Apr. 20, 2001 | TI-31429 |
| 09/923,510 | Aug. 6, 2001 | TI-31440 |
| 60/285,460 | Apr. 20, 2001 | TI-32926 |

FIELD OF THE INVENTION

This invention relates generally to optical wireless communications, and more specifically, to self-alignment of optical wireless links using positional feedback across the optical wireless channel.

BACKGROUND OF THE INVENTION

Modern data communications technologies have greatly expanded the ability to communicate large amounts of data over many types of communications facilities. This explosion in communications capability not only permits the communications of large databases, but has also enabled the digital communications of audio and video content. This high bandwidth communication is now carried out over a variety of facilities, including telephone lines (fiber optic as well as twisted-pair), coaxial cable such as supported by cable television service providers, dedicated network cabling within an office or home location, satellite links, and wireless telephony.

Each of these conventional communications facilities involves certain limitations in their deployment. In the case of communications over the telephone network, high-speed data transmission, such as that provided by digital subscriber line (DSL) services, must be carried out at a specific frequency range to not interfere with voice traffic, and is currently limited in the distance that such high-frequency communications can travel. Of course, communications over "wired" networks, including the telephone network, cable network, or dedicated network, requires the running of the physical wires among the locations to be served. This physical installation and maintenance is costly, as well as limiting to the user of the communications network.

Wireless communication facilities of course overcome the limitation of physical wires and cabling, and provide great flexibility to the user. Conventional wireless technologies involve their own limitations, however. For example, in the case of wireless telephony, the frequencies at which communications may be carried out are regulated and controlled. Furthermore, current wireless telephone communication of large data blocks, such as video, is prohibitively expensive, considering the per-unit-time charges for wireless services. Additionally, wireless telephone communications are subject to interference among the various users within the nearby area. Radio frequency data communication must also be carried out within specified frequencies, and is also vulnerable to interference from other transmissions. Satellite transmission is also currently expensive, particularly for bi-directional communications (i.e., beyond the passive reception of television programming).

A relatively new technology that has been proposed for data communications is the optical wireless network. According to this approach, data is transmitted by way of modulation of a light beam, in much the same manner as in the case of fiber optic telephone communications. A photoreceiver receives the modulated light, and demodulates the signal to retrieve the data. As opposed to fiber optic-based optical communications, however, this approach does not use a physical wire for transmission of the light signal. In the case of directed optical communications, a line-of-sight relationship between the transmitter and the receiver permits a modulated light beam, such as that produced by a laser, to travel without the waveguide of the fiber optic.

It is contemplated that the optical wireless network according to this approach will provide numerous important advantages. First, high frequency light can provide high bandwidth, for example ranging from on the order of 100 Mbps to several Gbps, using conventional technology. This high bandwidth need not be shared among users, when carried out over line-of-sight optical communications between transmitters and receivers. Without the other users on the link, of course, the bandwidth is not limited by interference from other users, as in the case of wireless telephony. Modulation can also be quite simple, as compared with multiple-user communications that require time or code multiplexing of multiple communications. Bi-directional communication can also be readily carried out according to this technology. Finally, optical frequencies are not currently regulated, and as such no licensing is required for the deployment of extra-premises networks.

These attributes of optical wireless networks make this technology attractive both for local networks within a building, and also for external networks. Indeed, it is contemplated that optical wireless communications may be useful in data communication within a room, such as for communicating video signals from a computer to a display device, such as a video projector.

It will be apparent to those skilled in the art having reference to this specification that the ability to correctly aim the transmitted light beam to the receiver is of importance in this technology. Particularly for laser-generated collimated beams, which can have quite small spot sizes (i.e. cross sectional area), the reliability and signal-to-noise ratio of the transmitted signal are degraded if the aim of the transmitting beam strays from the optimum point at the receiver. Especially considering that many contemplated applications of this technology are in connection with equipment that will not be precisely located, or that may move over time, the need exists to precisely aim and controllably adjust the aim of the light beam.

Co-pending application Ser. No. 09/310,284, filed May 12, 1999, entitled "Optical Switching Apparatus", commonly assigned herewith and incorporated herein by this reference, discloses a micro-mirror assembly for directing a light beam in an optical switching apparatus. The micromirror reflects the light beam in a manner that may be precisely controlled by electrical signals. The micro-mirror assembly includes a silicon mirror capable of rotating in two axes. One or more small magnets are attached to the micro-mirror itself; a set of four coil drivers are arranged in quadrants, and are current-controlled to attract or repel the micro-mirror magnets as desired, to tilt the micro-mirror in the desired direction.

Because the directed light beam, or laser beam, has an extremely small spot size, precise positioning of the mirror to aim the beam at the desired receiver is essential in establishing communication. This precision positioning is contemplated to be accomplished by way of calibration and feedback, so that the mirror is able to sense its position and make corrections.

Co-pending patent application Ser. No. 09/620,943 entitled "Optical Wireless Link," commonly assigned herewith and incorporated herein by reference, discloses one approach to providing a feedback signal from the receiver to the transmitter over a secondary link. As disclosed in the application, the feedback and control signals are transmitted over a low bandwidth link, such as a radio frequency (RF) link or a twisted pair or similar physical link.

Another approach to providing a light beam alignment feedback signal to the transmitter is disclosed in co-pending patent application Ser. No. 60/234,081 entitled "Optical Wireless Networking with Direct Beam Pointing," commonly assigned herewith and incorporated herein by reference. In that application, alignment feedback is provided passively by a receiver lens surrounded by a retro-reflective annulus.

As optical wireless links become more prevalent, users will demand greater autonomy in the devices as they are deployed in networks and real-world environments. One area of autonomy that will be expected of such devices is the ability to automatically acquire the signal of a remote link in order to establish the optical wireless communication channel between them. Therefore, a need exists in the art for an optical wireless link that can automatically acquire a line-of-sight communication with another optical wireless link.

SUMMARY OF THE INVENTION

In one aspect, the present invention provides for a method of aligning two optical wireless links, each optical wireless link having a light beam having a field of view. The method comprises sweeping the first light beam of the first optical wireless link through a first pre-defined pattern and sweeping the second light beam of the second optical wireless link through a second pre-defined pattern. The first light beam transmits position data for the first light beam and the second light beam transmits position data for the second light beam. The method further comprises detecting the second light beam at the first optical wireless device, transmitting on the first light beam the position data for the second light beam, detecting the first light beam at the second optical wireless device, and transmitting on the second light beam, the position data for the first light beam.

In another aspect, the invention provides for an optical wireless link comprising a light beam transmitter configured to transmit a first light beam, a light beam steering device, the light beam steering device configured to steer the light beam in a pre-defined pattern during an alignment acquisition phase, and a light beam modulator, configured to modulate the first light beam with light beam position information. The optical wireless link also comprises a photodetector configured to receive a second modulated light beam containing alignment feedback information. The light beam steering device aligns the modulated light beam to a position indicated by the alignment feedback information, and the light beam modulator is configured to modulate the first light beam with a portion of the alignment feedback information subsequent to the photodetector receiving the second modulated light beam.

In yet another aspect, the invention provides for a method of communicating between two data devices. The method includes coupling a first data device to a first optical wireless link, coupling a second data device to a second optical wireless link, and aligning the first and second optical wireless links. The aligning step includes modulating a first light beam with first position information and sweeping the first light beam through a pre-defined acquisition pattern, modulating a second light beam with second position information and sweeping the second light beam through a pre-defined acquisition pattern, detecting the second light beam at the first optical wireless device, detecting the first light beam at the second optical wireless device, echoing the second position information back to the second optical wireless device via the first light beam, echoing the first position information back to the first optical wireless device via the second light beam, aligning the first light beam to a position indicated by the second echoing step, and aligning the first light beam to a position indicated by the second echoing step. The method also includes communicating data between the first and second data devices over the first and second light beams, subsequent to the aligning step.

The preferred embodiments of the present invention provide the advantage of an optical wireless link that can acquire a line-of-sight communication with another optical wireless link without user intervention.

Additionally, the preferred embodiments provide the advantage that the optical wireless links can be aligned to each other quickly, in order to expedite the establishment of communication between them.

Another provided advantage is the ability to re-acquire the line-of-sight communication in the event of an unexpected event, such as one or both of the optical wireless links being bumped or disturbed in some manner.

Another provided advantage is the ability for the optical wireless link to automatically optimize signal reliability and signal to noise ratio by having the optical wireless link re-position its beam based upon feedback signals from the beam receiving device.

BRIEF DESCRIPTION OF THE DRAWINGS

The above features of the present invention will be more clearly understood from consideration of the following descriptions in connection with accompanying drawings in which:

FIGS. 6a and 6b schematically illustrate two preferred embodiments for an optical detector;

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1:
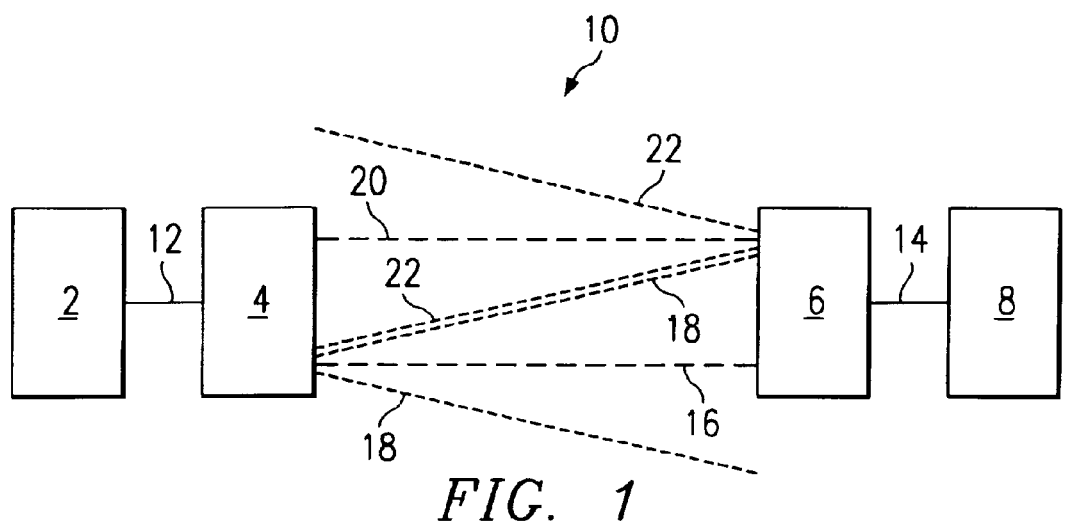
FIG. 1 illustrates a preferred embodiment wireless optical communication system.

FIG. 1 illustrates a preferred embodiment optical wireless system 10, including a first data source/sink 2 connected to a first Optical Wireless Link ("OWL") 4. The OWL 4 can both transmit to and receive data from a second OWL 6 over a wireless optical path. OWL 6 is in turn connected to a second data sink/source 8. Preferably each OWL device is an optical path-to-sight modem. As used herein, the term path-to-sight is intended to mean an unobstructed optical path generally through the ether, as contrasted with through an optic fiber, which path can include reflection. An advantageous feature of the OWL devices is that the optical beam is a narrow, collimated light beam, such as provided by a laser or collimated laser diode. The narrow beam allows for a lower power laser source to be used, because the optical power is concentrated in a small area. While this provides an advantage in terms such as eye safety and lower power consumption, it provides a commensurate disadvantage that it is difficult to align the collimated light beam to the receiving photodetector (because of the relatively small beam size). This disadvantage becomes more pronounced as the distance between the two OWLs increases, because a small angular misalignment becomes more pronounced as the overall beam length is increased.

Data sink/sources 2, 8 could be any type of data device, such as a computer, a LAN network, an Ethernet device, a telephony device or switch, and the like. Data sink/sources 2, 8 communicate with OWLs 4, 6, respectively over a data connections 12, 14, respectively. These data connections (e.g., twisted pair, cable, fiber optic) are typically physical connections operating under a standard protocol, such as Ethernet, TCP/IP, ATM, and the like. Data connections 12, 14 could also be RF based wireless connections in some applications.

OWL 4 communicates with OWL 6 over a collimated light beam 16. OWL 4 has a field of view 18 and the receiver of OWL 6 must be positioned within the field of view 18 for effective communication. Likewise, OWL 6 has a field of view 22 in which it can transmit a collimated light beam 20 to the receiver of OWL 4. As described in greater detail in co-pending patent application Ser. No. 09/620,943, signal to noise ration (SNR) is maximized when the light beams 16, 20 are centered on the photo-receivers of the receiving units 6, 4, respectively. The alignment of the light beam can be detected as a function of received optical power, signal intensity, and the like and this detected alignment information can then be fed back to the transmitter. Also described in greater detail in co-pending patent application Ser. No. 09/620,943 is a preferred embodiment mechanism for controllably steering the light beam. In addition to transmitting data to or from data from data source/sink 8, OWL 6 transmits the light beam alignment feedback signals to OWL 4 over light beam 20. Likewise, OWL 4 transmits beam alignment feedback signals to OWL 6 over its light beam 16, in addition to data to or from data source/sink 2. Because light beams 16, 20 are high bandwidth, low latency paths, the transmission of feedback signals over the beams allows for rapid alignment of the beams (low latency) without degrading the data handling capabilities of the system (high bandwidth). In the preferred embodiments, OWL devices 4 and 6 communicate with each other using standard 100 Mb/s Ethernet protocol. The inventive concepts described herein apply equally to other communication protocols, including ATM, TCP/IP, SONET, IEEE 1394, IRDA, 10 Mb/s Ethernet, Gigabit Ethernet, and other alternatives within the purview of one skilled in the art.

Details regarding the apparatus and method for communicating alignment control signals between OWLs 4 and 6 are provided in co-pending, commonly assigned patent application Ser. No. 09/923,510, filed Aug. 6, 2001, and entitled "System and Method for Embedding Control Information within an Optical Wireless Link" and incorporated herein by reference. Details regarding a method for allowing the OWLs 4 and 6 to automatically, efficiently and quickly align themselves to one another will be provided herein.

In the preferred embodiments, OWL 4 and OWL 6 are mounted to respective fixtures for operation. Examples of fixture might include affixing an OWL within the housing of a personal computer, mounting an OWL to a wall with a bracket, positioning an OWL on a counter-top, desk-top, or other work surface, mounted on a cubical wall, and the like. The primary requirement for the fixture is that it affixes the OWL relatively stably in the proper position vis-à-vis another OWL with which it is desired to communicate over line-of-sight beams 16 and 22. A first level of alignment is provided by positioning the OWLs 4 and 6 in their respective fixtures such that the two devices have their beam transmitters generally pointing toward each other, as shown in FIG. 1. Although a fixture is preferable in order to minimize the likelihood that the OWL will be moved out of alignment, it is not necessary for the teachings of the present invention that a fixture be employed. In some embodiments, the OWL will be simply placed on a work surface and pointed in the direction of a remote OWL. One skilled in the art will recognize that care should be taken to ensure that the OWL will not be unduly disturbed or moved during operation.

Figure 2:
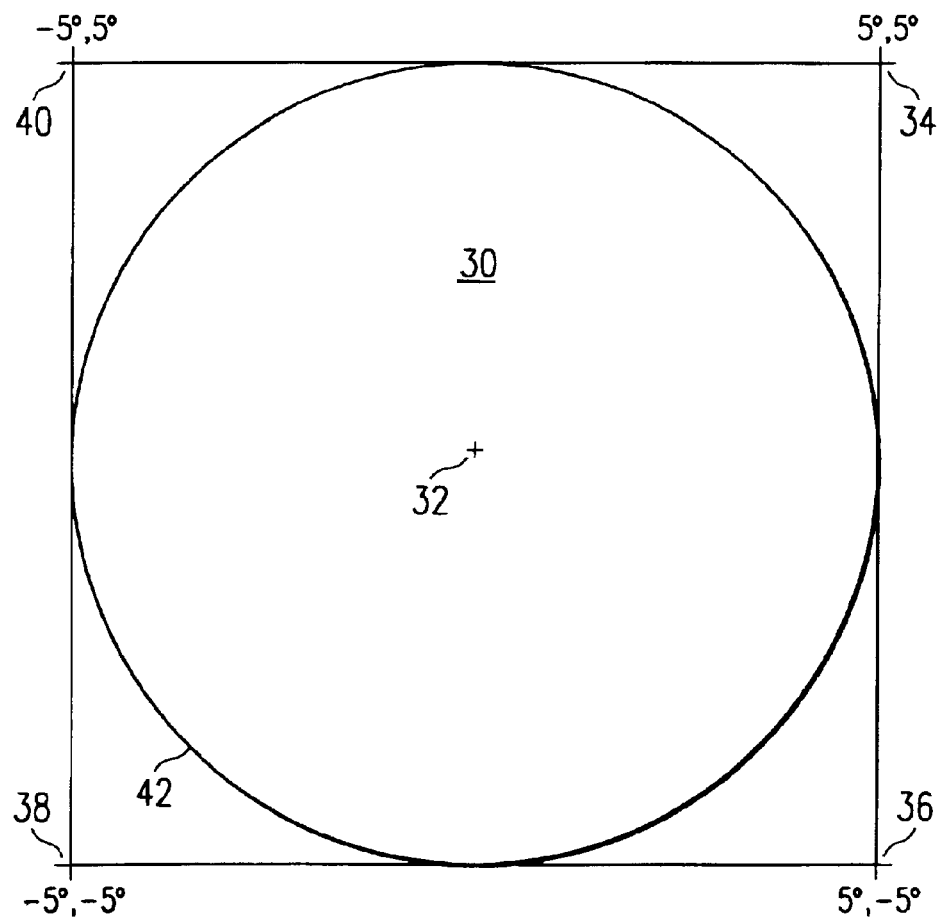
FIG. 2 illustrates the field of view of a preferred embodiment optical wireless link.

In the preferred embodiments, each OWL has beam steering capability providing a field of view 30 of ten degrees in both an x axis and a y axis, as shown in FIG. 2. The neutral, or default position for the light beam is in the center of the field of view, as indicated by point 32. The beam can be deflected as much as five degrees along the x axis, in either direction, and as much as five degrees in either direction along the y axis. Hence, point 34 illustrates the beam having been deflected five degrees positively along the x axis and five degrees positively along the y axis. Point 36 illustrates where the light beam would point when it is deflected five degrees positively along the x axis and five degrees negatively along the y axis. Likewise, point 38 illustrates where the light beam would point when it has been deflected five degrees negatively in both the x and y axes, and point 40 illustrates the beam having been deflected five degrees negatively in the x axis and five degrees positively in the y axis. Of course, the beam could be deflected less than five degrees in either direction, and hence the beam could be deflected to point anywhere within the field of view 30.

Also shown in FIG. 2 is the field of view 42 of receiving OWL 6. This represents the area for which the photodetector of the receiving OWL can detect an incoming light beam. Because the photodetector of receiving device has a round field of view, the light beam deflection will preferably be limited to the round area 42.

In the following discussion, it is assumed that two exemplary OWLs 4, 6 have been mounted in their respective fixtures and have been grossly aligned with one another such that the photodetector of OWL 6 lies somewhere within the field of view 30 for OWL 4 and the photodetector of OWL 4 lies somewhere within the field of view 30 for OWL 6. The devices are not finely aligned and the light beams are not (necessarily) impinging upon the photodetectors, however, and hence they cannot communicate with each other. An advantageous feature of the preferred embodiment devices is that the light beams can be steered using a micro-mirror or other beam steering device, without physically moving or re-aligning the OWL itself. Hence, once the OWL device is put in place, the following described alignment and signal acquisition is accomplished through controllably steering the light beam, rather than through physically moving or re-aligning the OWL device itself.

Acquisition preferably begins with the device going through an initiation process in which the various circuits and components perform self check routines, which routines are typically stored on non-volatile memory. In the preferred embodiments, the non-volatile memory is located within the OWL itself, although memory could also be located in other devices, to which the OWL is connected through an appropriate network connection. Once the device is fully initiated, it will begin its acquisition routine in which the device will attempt to establish communication with another OWL (or similar optical wireless communication device), which device is presumably within its field of view 30. Obviously, if the remote device is not within the OWL's field of view 30, then the devices will be unable to establish communication.

Figure 3:
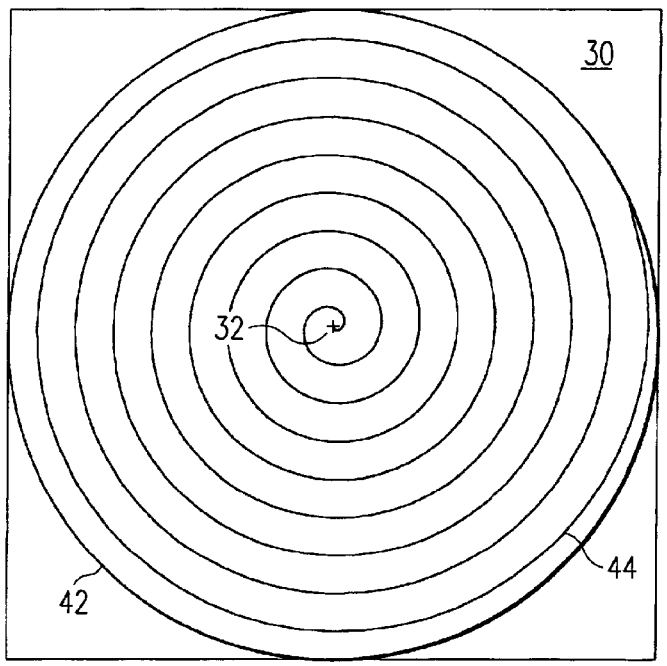
FIG. 3 illustrates a preferred embodiment acquisition pattern.

In the first preferred embodiment, OWL 4 begins the acquisition process by positioning its light beam 16 (FIG. 1) at the default of center location 32 and beginning to sweep its beam in an expanding spiral pattern 44, as illustrated in FIG. 3, until the spiral pattern has a diameter as large as the field of view 42 of the receiving photodetector of the remote OWL device. Once the beam has expanded to its maximum diameter, the beam then is swept through a decreasing spiral pattern back toward the center position 32. OWL 6 will also have initiated itself and will also be sweeping its own light beam through a similar spiral pattern. Eventually at some point in the sweep pattern, the light beam from OWL 4 will impinge upon the photodetector of OWL 6. Likewise, at some point during the sweep pattern of OWL 6, its light beam will impinge upon the photodetector of OWL 4. Initially, however, neither device will have any intelligence regarding the position of the other.

As the light beam is swept through the acquisition pattern described above, OWL 4 transmits an alignment control packet over the light beam, by modulating the light beam as is known in the art. As will be described in further detail below, the control packet contains various values relative to alignment. Each control packet contains the position of the transmitting beam for OWL 4 (i.e. the x and y coordinates relative to some reference point, such as center point 32). These coordinates are referred to as "My X" and "My Y" for convenience of reference. Alternatively, it should be apparent to one skilled in the art that other representations of position such as radius and angle could be used in place of position values X and Y. Note that these coordinates will change with each transmitted control packet because the beam is sweeping the pattern 44 illustrated in FIG. 3. Additionally, the control packet also contains the beam position of OWL 6 that was last received by OWL 4. This information is also transmitted in terms of the x and y coordinates for the beam of OWL 6 (referred to as "Your X" and "Your Y" for convenience). Note that at the beginning of the acquisition process, OWL 4 will not yet have received any control packets from OWL 6 (i.e. OWL 4 will have no values for Your X and Your Y). As such, initially, the control packet will contain a pre-defined number or string for these values. In a preferred embodiment, OWL 4 will transmit all 1's or some other string that indicates "unknown" for the values of Your X and Your Y. OWL 6 will recognize from this that OWL 4 has not yet received beam position information from OWL 6.

Eventually at some point during the sweep pattern, the light beam of OWL 6 will impinge upon the photodetector of OWL 4 and OWL 4 will receive a control packet from OWL 6. As described above, the control packet will contain the beam position information for OWL 6 at that point in its sweep pattern 44 in which the beam was pointing at OWL 4's photodetector. In other words, the "My X" and "My Y" values transmitted in the control packet that reached OWL 4 correspond to the position at which point OWL 6 is aligned with OWL 4. OWL 6 has no way of knowing at that time, however, that its light beam impinged upon OWL 4, so OWL 6 continues its sweep pattern 44. At this point, OWL 4 will update its control packets to include the beam position information received from OWL 6. In other words, OWL 4 takes the values for "My X" and "My Y" received from OWL 6 and inserts those values into the "Your X" and "Your Y" fields of its own control packets. At this point, OWL 4 will be transmitting back to OWL 6 the beam position information it received when OWL 6 was aligned to OWL 4.

At some subsequent point during OWL 4's sweep, its beam will impinge upon the photodetector for OWL 6 and OWL 6 will receive the OWL 4 control packet. That packet contains the position information for OWL 4 as well as the position information received from OWL 6. Upon receiving the control packet containing valid "Your X" and "Your Y" values, OWL 6 will re-align its light beam to the position dictated by the "Your X" and "Your Y" values. OWL 6 will also update its own "Your X" and "Your Y" fields with the position information it received about OWL 4 (in other words the "My X" and "My Y" values it received from OWL 4). OWL 6 will then begin transmitting control packets containing both its beam position and the beam position it received from OWL 4. Because OWL 6 has positioned its beam to the point where OWL 4 last received the signal, it will be transmitting at or very near the optimal alignment point. OWL 4 will then receive the control packet containing valid data in the "Your X" and "Your Y" fields, thus indicating to OWL 4 that the point where OWL 4's beam was aligned to OWL 6. Owl 4 will re-position its light beam in accordance with the received position information, will update its own "My X" and "My Y" values, and will transmit additional control packets.

At this point, the two devices will be nominally aligned because each OWL will have its beam positioned at a point where the receiving device had been able to receive it. Having established communication in this way, the OWL devices will then transition into an operational mode where data between data source/sinks 2 and 8 can begin. Periodically, both OWL 4 and OWL 6 will re-transmit a control packet to ensure the devices remain in alignment as described in detail in co-pending patent application Ser. No.

09/923,510 entitled "System and Method for Embedding Control Information within an Optical Wireless Link."

The above described method of aligning two devices can be thought of "echoing" alignment information back to its source. Initially, the first optical device has no alignment intelligence and simply transmits its beam position information out blindly, updating the position information as the beam sweeps through the acquisition pattern. Eventually, the beam will impinge upon a second optical device, which will receive the beam position information for the first device. This second device will then begin echoing back the position information for the first device (as well as its own periodically updated position information) as the second beam is swept through its acquisition pattern. When the second beam impinges upon the photodetector of the first device, the first device then receives its own position information echoed back to it. Because the position information has been echoed back to it, the device knows that it was nominally aligned at that position. Likewise, the first device will echo back to the second device the beam position information it received from the second device.

In another preferred embodiment, OWL 4 will align its beam to the position indicated by the received "Your X" and "Your Y" values and will then initiate a second alignment sweep pattern, the pattern being centered on the "Your X" and "Your Y" coordinates. This is done to optimize the device alignment. OWL 6 would preferably also perform a second, fine alignment as well after the initial alignment process has been completed. As will be described in further detail below, OWL 6 also feeds back fine alignment detail to OWL 4 for further beam alignment adjustment.

Figure 4:
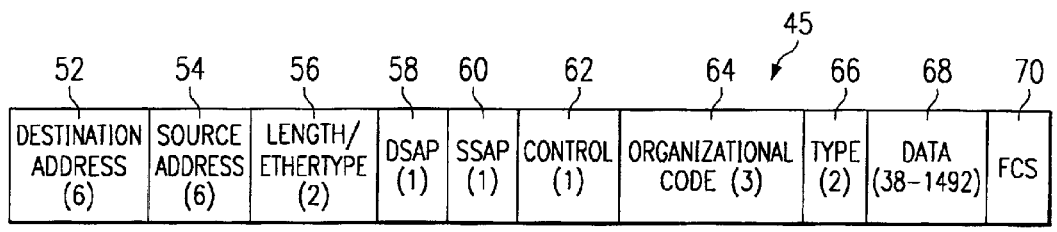
FIG. 4 illustrates a control packet for transmitting alignment information in a preferred embodiment system.

FIGS. 4 and 5 provide additional details regarding the control packets. The packet, defined in link level protocol, is preferably 64 bytes in length. Preferably the control packet is compliant with the IEEE SubNetwork Access Protocol 802.2 (SNAP). As shown, the SNAP packet contains a six byte destination address field 52 and a six byte source address field 54. These addresses are the 48-bit Ethernet hardware addresses of the receiving and sending unit, respectively. The two byte length/Ethertype field 56 designates the frame type. The protocol being used is defined by the single byte destination service access point (DSAP) and source service access point (SSAP) fields 58 and 60, respectively. These fields define the protocol for controlling the routing of packets at the physical layer. Likewise, the control field 62 provides additional link layer control information. The three byte organizational code 64 is used to define proprietary packets. This three byte code is assigned to individual organizations by the IEEE to allow the organization to uniquely identify their SNAP packets. Data field 68 is variable in length from 38 to 1492 bytes. In the preferred embodiments, data field 68 is set as small as possible, to 38 bytes, in order to minimize bandwidth overhead. Finally, FCS field 70 is a frame check sequence. This field is used to perform cyclic redundancy check (CRC) on the incoming frame to check for errors, as is well known in the art.

The SNAP format provides the advantage of small size packets, hence minimizing bandwidth overhead. Additionally, the SNAP format can be employed without the need for a network stack because the protocol does not require an IP address look-up function. One skilled in the art will recognize that other standard protocols or even non-standard proprietary protocols could be employed in lieu of the SNAP protocol packets. For instance, in some embodiments, it may be preferable to format the control packets as TCP/IP packets. Such an alternative would be preferable in that IP packets can be configured to terminate upon reaching their destination (in this case, the control logic 26 of OWLs 2 and 6). This would prevent the control packet from passing through the OWL and onto the connected network or network device 2, 8. Furthermore, an IP protocol pre-supposes that the OWL would have an IP address. While this requires a network stack for the OWL, it also implies that the OWL would hence be "accessible" to the network from a network management standpoint.

Figure 5A:
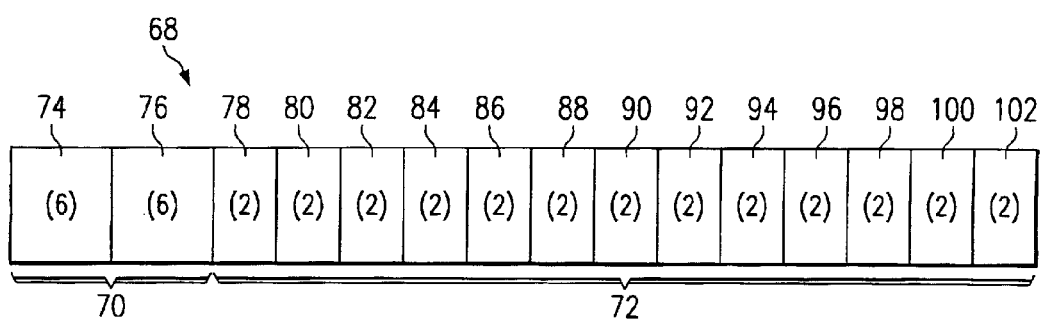
FIGS. 5a and 5b provide further details of the control packet.
Figure 5B:
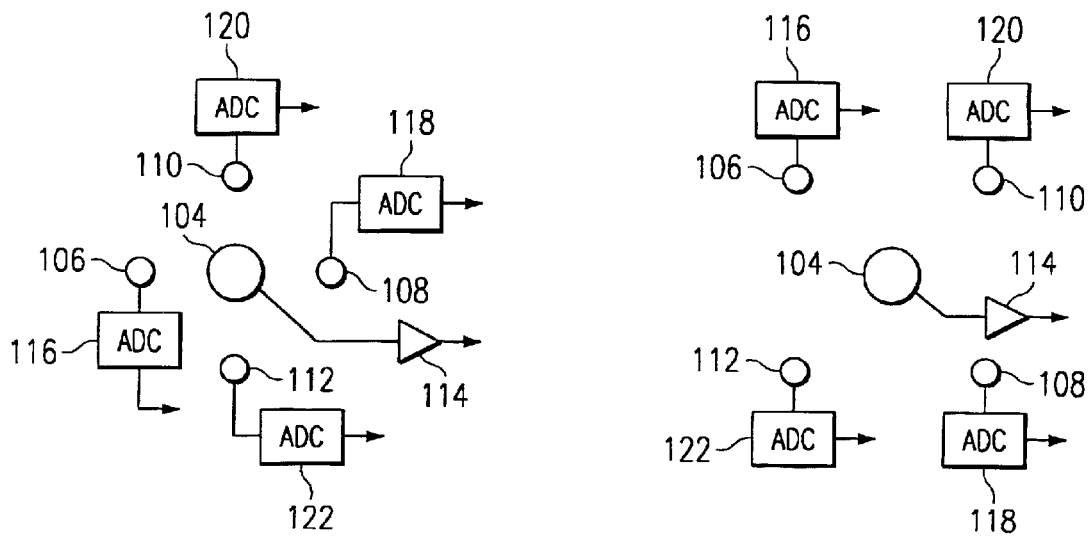

A preferred arrangement of the data field 68, i.e. the actual control data, is provided in FIG. 5a. The 38 byte field is logically divided into a twelve byte MCU Header 70 that contains the physical addresses of the two units (i.e. the sending unit and the receiving unit) and a 26 byte Servo Header 72 that contains the control signals. FIG. 5b provides further detail regarding the logical organization of data field 68. As shown, the field contains two six bit fields, 74, 76, defining the physical address of the sending unit and the receiving unit, respectively. These comprise the MCU Header. The Servo Header comprises thirteen two-byte fields, including control field 78 and a two byte status field 80, which indicate the current mode of the OWL unit, such as seeking or tracking. The Servo Header also includes a sample field 80 that identifies the particular sample for which feedback is being provided and a "Last Sample Seen" 82 that identifies the last sample that was fed back. These fields can be used by the receiving unit to "recreate" its mirror position at the time the other unit last received a good optical signal. The "Time Stamp" field 84 also aids in this regard, and can be used by the receiving unit to "recreate" its mirror position at some previous point in time relative to the time stamp. The x and y coordinates of the light beam positioning for the sending unit is provided in the "My X" and "My Y" fields 88 and 90, respectively, and the x and y coordinates for the receiving unit are also sent in fields 92 and 94. This information ensures that the two devices have a common "understanding" of their relative positions to each other.

Finally, four alignment parameters "Quad Position X," "Quad Position Y," "Quad Sum X," and "Quad Sum Y" are also transmitted in fields 96, 98, 100, and 102, respectively. These parameters are used for fine alignment feedback and will be described with reference to FIGS. 6a and 6b. FIG. 6a schematically illustrates a preferred embodiment photodetector, such as would be employed in the optical module 30 of OWLs 4 and 6. The photodetector comprises a data detector 104 and four servo detectors, two along the x axis and two along the y axis and identified by reference numerals 106, 108, 100, and 112, respectively. Data detector 104 is preferably a Si PIN detector and is connected to a pre-amplifier 114 where the received signal is amplified before being passed to signal amplifying and processing circuitry (not shown) as is well known to those skilled in the art. Servo detectors 106–112 are preferably low bandwidth light-to-voltage converters containing an integrated amplifier such as a TAOS 254. Each servo detector is coupled to an analog to digital converter where the intensity of the light impinging upon the associated servo detector is converted into a digital value proportionate to the light intensity. By comparing the digital values from ADCs 116, 118, 120, and 122 (corresponding to the light intensity at servo detectors 106, 108, 110, and 112, respectively), the alignment of the impinging light beam relative the centrally located data detector can be determined. As an example, assuming the value being received from ADC 120 is higher than the value being received from ADC 122, this would indicate that the light beam is misaligned and in impinging above the center of data detector 104. By feeding this information back to the transmitter, as described above, the beam can be re-positioned to impinge lower upon data detector 104. Likewise, if the value being received from ADC 122 is higher than for ADC 120, this would indicate that the beam is too low and needs to be adjusted upwards. As discussed above, these parameters are fed back to the transmitting unit wherein the light beam is re-directed to more precisely align the beam. Further details on the steering of the light beam are provided in co-pending patent application Ser. No. 09/620,943.

FIG. 6b illustrates another preferred embodiment configuration for the photodetector, wherein the servo detectors are located on 45° axes relative the centrally located data detector 104. This configuration is preferable in that two detectors can be used for determining the alignment in the x axis and two detectors for determining alignment in the y axis. In other words, under the configuration illustrated in FIG. 6b, the relative value of both servo detectors 108 and 110 compared to both 106 and 112 would be used for alignment in the x direction, and the relative value of servo detectors 106 and 110 to servo detectors 108 and 112 would be compared for alignment in the y direction.

Returning now to the control packet parameters illustrated in FIG. 5b. In the currently preferred embodiments, "Quad Sum X" and "Quad Sum Y" provide the sum of the intensity signal value received at all four servo detectors 106, 108, 110, 112. One skilled in the art will recognize that other combinations of the intensity signals could also be employed. "Quad Position X" provides feedback information relating to the alignment of the incoming beam along the x axis and is defined as: ((NE+SE)-(NW-SW))/(NE+SE+SW+NW), where NE is the signal from servo detector 110 (i.e. the detector in the "northeast" quadrant), SE is the signal from servo detector 108 (the "southeast" quadrant), NW is the signal from servo detector 106, and SW is the signal from servo detector 112. Likewise, "Quad Y Position" provides the fine alignment of the received beam along the vertical (y) axis. This field is defined as ((NE+NW)-(SE+SW))/(NE+SE+SW+NW). As is apparent form the formula, the Quad X Position field provides the relative signal intensity of the rightmost detectors (108 and 100) relative to the leftmost detectors (106 and 112), normalized to the overall received intensity (i.e. the sum of all four detectors). Likewise, Quad Y Position provides the relative signal intensity of the upper detectors (106 and 110) relative to the lower detectors (108 and 112), normalized to the overall received intensity.

In the above described embodiments, each OWL performs a sweep pattern in the shape of an expanding spiral followed by a decreasing spiral. In other embodiments, the pattern could begin at the outer edge of the field of view 30 and spiral inward initially followed by an outward expanding spiral. In the preferred embodiments, the beam speed is adjusted such that the beam sweeps twenty circles of the spiral pattern each second. In the preferred embodiment, the field of view 30 for each OWL device is five degrees in each direction (i.e. five degrees positive and five degrees negative along both axes). This corresponds to plus or minus 85 mrad in each direction. With a typical light beam size of 1 mrad, the field of view 30 would be encompass 85 circles for one complete spiral sweep from the center to the outer edge (and likewise, 85 circles sweeps for the spiral sweep from the outer edge to the center). Again assuming twenty circles per second, OWL 4 can sweep one spiral pattern in approximately 4.25 seconds.

Figure 7:
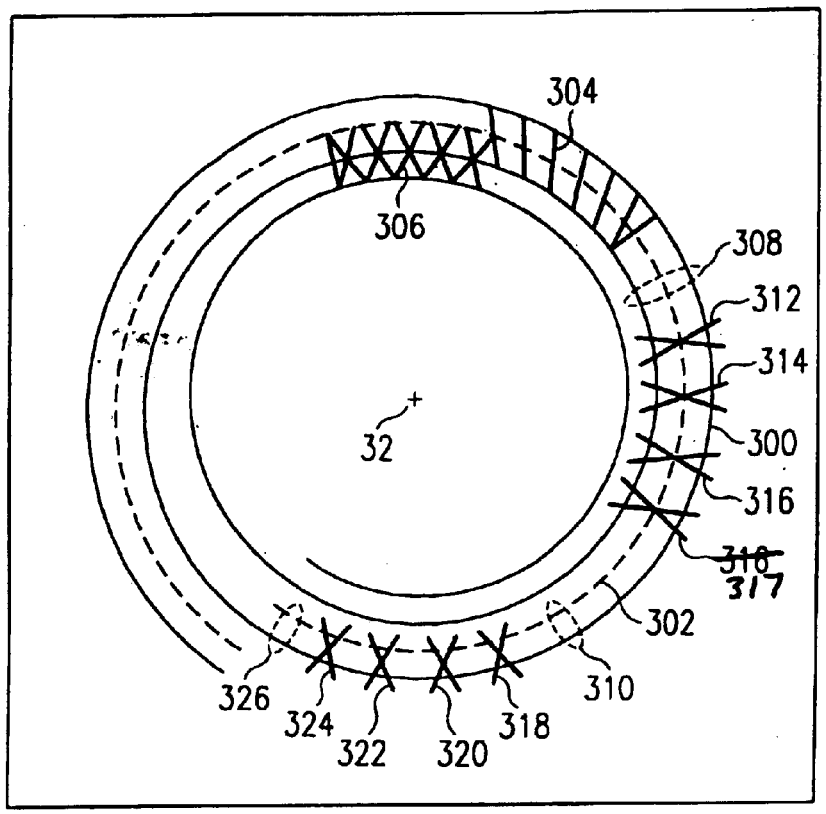
FIG. 7 illustrates further details of a preferred embodiment acquisition pattern.

In the preferred embodiments, the circles will overlap each other by approximately fifty percent in order to increase the likelihood of impinging upon the target photodetector while a control packet is being transmitted (control packets are transmitted at approximately 4 kHz, or once every 250 µs), as shown in FIG. 7. Each beam pattern 300, 302 is one mrad wide (i.e. the beam size). The first circle 300 is swept followed by a second circle 302 that is offset from the first circle 300 by only 0.5 mrad. Note that the beam is modulated with the control packet information at points 304 and 306 and that the beam is moving during the transmission period. The beam might not be aligned with the photodetector during the period 304 of the first sweep, but may be aligned during the period 306 during the second overlapping sweep. Because of this overlap, one full spiral scan takes 170 circles, resulting in approximately 8.5 seconds per scan.

In other embodiments, the beam might be swept through the spiral pattern at a constant velocity, resulting in the inner circles being scanned very quickly relative to the outer circles. Constant velocity rotation is well known in the art of magnetic storage media (such as disk drives) where the need for constant data streaming is crucial to the application. In the preferred embodiments of the present invention, there is not a critical need for constant data streaming, so the additional computation complexity required for constant velocity need not be incurred.

The advantageous feature of the spiral scan pattern is that the pattern is free of sudden discontinuities in position and its derivatives. Such discontinuities can excite resonance in the mechanical structure of the micro-mirror (or other beam steering device) or its mounting, leading to undesirable oscillations. Therefore, even though other scan patterns are within the scope of the present invention, including linear raster scanning, a square spiral patterns, and the like, care must be taken to minimize the effects of directional or positional discontinuities in such embodiments.

In the above described embodiments, the alignment information was fed back to the transmitting OWL in terms of x and y coordinates ("My X" and "My Y" and "Your X" and "Your Y" fields). Additionally or alternatively, the alignment information can be fed back in other ways. For instance, the preferred control packet 45 contains a "Time Stamp" field 86 (FIG. 5b). This Time Stamp can be an absolute time value, or a time value relative to some arbitrary time reference point. Upon receiving a control packet from a first transmitting OWL, the second receiving OWL can return the Time Stamp value back to the first OWL during its acquisition scan. When the first OWL receives the control packet from the second OWL, it will include the Time Stamp that indicates the point in time in which the first OWL was aligned to the second OWL. Because the first OWL knows the amount of time elapsed since the Time Stamp time, and knows the sweep pattern of its beam, the first OWL can re-align its beam to the position it was at at the time of the Time Stamp. At this point, the first OWL should be nominally aligned. The same process could be employed to align the second OWL on the basis of its Time Stamp information as well.

In another embodiment, the OWLs could feed back alignment information using the "Sample #" field 82 and "Last Sample Seen" field 84 in much the same way. Each control packet will contain an updated sample number and each OWL will "remember" its beam position corresponding to that sample number. The receiving OWL will update its own control packet with a "Last Sample Seen" value once it receives a control packet, much as the "Your X" and "Your Y" fields are updated in the above described embodiment. When an OWL receives a control packet having a valid "Last Sample Seen" value, the OWL will re-align its beam to correspond to the position of that Sample number. Likewise, the OWL will update its own Last Sample Seen field with the Sample number received in the incoming control packet.

In the presently preferred embodiments, the light beam position information can only be updated approximately once evely 250 μs or at 4 kHz. This is because of the time required to physically measure and calculate the position of the light beam steering device, such as a micro-mirror (as described in detail in co-pending applications Ser. Nos. 60/234,081 and 60/233,851. Hence, the control packet "My X" and "My Y" information is updated only once every 250 μs. Note, however, that the control packet is preferably only 5 μs long when transmitted over the 100 Mb/s Ethernet protocol optical wireless channel (64 bytes×8 bits/byte×100 Mb/s=5 μs). Ethernet protocol requires a minimum spacing between each frame (or packet) on the order of 1 or 2 μs. Hence, it is possible under the protocol to transmit a control packet over the modulated light beam every 6 or 7 μs. As stated above, however, the position information is updated approximately only every 250 μs. Nonetheless, in another preferred embodiment approach, the control packets are "over-sampled," i.e. sent out at a higher rate than the 4 kHz rate at which the position information is updated. This is illustrated schematically in FIG. 7. As shown, in the above described embodiment, a first control packet is sent at the point in time when the sweep pattern is at the point indicated by point 308. 250 μs later, a next data packet containing updated position data is sent, at the point indicated by 310. In the alternative embodiment with over-sampling, additional control packets, indicated by points 312, 314, 316, and 317 are transmitted. Note that these packets are sent every 50 μs. As such, the control packets 312 through 318 do not contain updated beam position information. Not until the position indicated at 310 (250 μs later) is the beam position information updated. Note that the beam position information is therefore not entirely accurate for those intermediate control packets 312 through 317. In other words, the beam position information ("My X" and "My Y") being transmitted at point 308 is accurate for point 308, but that same information is then sent again at points 312 through 317, even though the beam has moved along its sweep pattern. Not until point 310 is the beam information updated to the x and y coordinates for point 310. Again the x and y coordinate information for point 310 is re-sent at points 318, 320, 322, and 324. At point 326, the x and y information is once again updated to the new position. The rationale behind over-sampling in this manner is that the chances of aligning the light beam with the remote photodetector at a time the light beam is transmitting the control packet is significantly increased by sending the control packet five times as often (as indicated by the difference in the spacing between points 308 and 310 versus the difference in the spacing between points 308 and 312). Therefore, even though the x and y coordinate position information is not entirely accurate for four out of the five times the control packet is transmitted, the information is accurate enough for a first pass alignment. The inherent inaccuracy is not as significant as the increased benefit derived from over-sampling. While the preferred embodiment is described in terms of five times over-sampling, one skilled in the art will recognize that an even greater over-sampling rate will further increase the likelihood of transmitting a control packet when the beam impinges upon the remote photodetector. The practical limit to the over-sampling rate would depend upon the length of the control packet, the need for inter-frame spacing, and the sweep speed of the beam itself. On the other hand, a lesser over-sampling rate (such as two times) would not provide as great a benefit, but would nonetheless increase the chances of transmitting a control packet at the right time.

Figure 8:
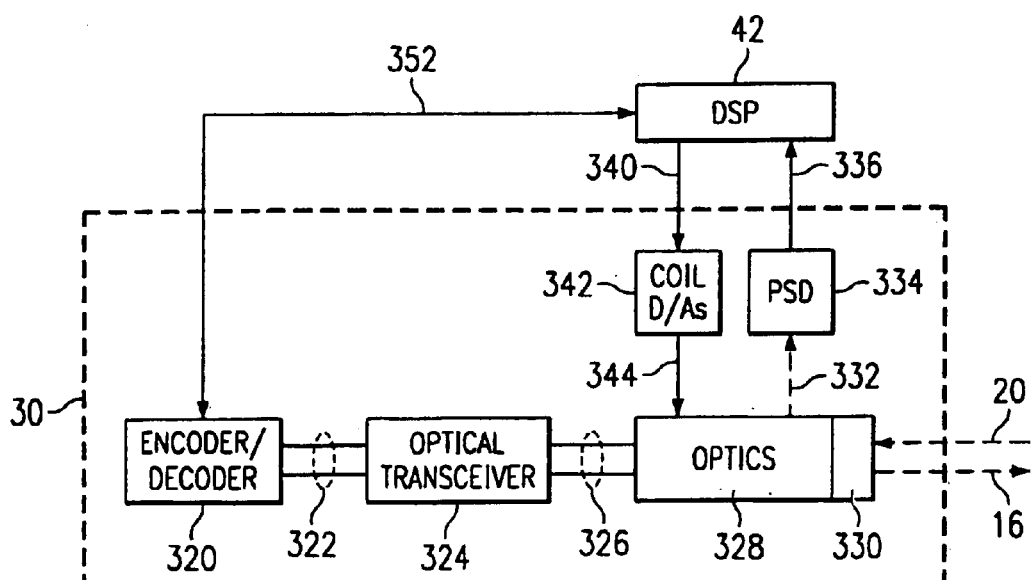
FIG. 8 illustrates details of an optical wireless link employed in embodiments of the present invention.

One embodiment of an optical module 30 is provided in FIG. 8. The module includes an Encoder/Decoder Unit 320, coupled by a two-way Data Link 322 to an Optical Transceiver Unit (OTU) 324. The OTU 324 acts as an electrical to light and light to electrical converter. It contains a light source, such as a laser or light emitting diode, control electronics for the light source, a photo-detector for converting the received light to electrical signals and amplifiers to boost the electrical strength to that compatible with the decoder.

The OTU 324 can also be of conventional design. For example, a TTC-2C13 available from TrueLight Corporation of Taiwan, R.O.C., provides an advantageous and low cost optical transceiver unit, requiring only a single+5V power supply, consuming low power, and providing high bandwidth. However, it should be noted that OTU units of conventional design can provide less than optimal performance, since such units are typically designed for transmitting and receiving light from fibers. This results in three problems that should be noted by the designer. First, light is contained in such units and is thus not subject to the same eye safety considerations as open air optical systems such as the present invention. Consequently, such units may have excessively high power. Second, light is transmitted to a fiber and thus has optical requirements that are different from those where collimation is required, as in embodiments of the present invention. Third, light is received by such units from a narrow fiber, and therefore such units usually have smaller detector areas than desired for embodiments of the present invention. Accordingly, it is considered preferable to assemble a transceiver having a photodiode and optical design such that the maximum amount of light is collected from a given field of view. This requires as large a photodiode as possible, with the upper limit being influenced by factors such as photodiode speed and cost. In any event, a preferred light source is a vertical cavity surface emitting laser, sometimes referred to as a VCSEL laser diode. Such laser diodes have, advantageously, a substantially circular cross-section emission beam, a narrow emission cone and less dependence on temperature.

The Optical Transceiver Unit 324 is coupled by a two-way data link 326 to Optics 328. The Optics 328 contains optical components for collimating or focusing the outgoing light beam 16 from the transceiver, a micro-mirror controlled by, e.g., electromagnetic coils, for directing the collimated light in the direction of a second OWL (not shown), with which OWL is in communication, and receiving optics to concentrate the light received from the second OWL on a transceiver photodetector included in the Optics 328. The receiving optics can include a control mirror, either flat or curved, to direct the light to the photodetector. Auxiliary photo detectors can be provided adjacent to the main photodetector for light detection in connection with a control subsystem (not shown), for controlling the control mirror, and maximize the light capture at the photodetector. The Optics 328 may also contain a spectral filter 330 to filter ambient light from the incoming signal light 20. The Optics 328 is preferably, but need not be a micro-mirror. Any controllable beam steering device can be used that changes the direction of the light beam without changing the orientation of the light emitter. In addition, a basic function of the Optics 328 is that it sufficiently collimates the light beam that will (1) substantially fit within the micro-mirror reflecting area, and (2) preserve the minimum detectable power density over the distance of the link. Laser diodes generally meet these criteria, and as such are preferred. However, light emitting diodes (LEDs) and other light sources can be made to satisfy these criteria as well.

For optical wireless links across large distances where the highest possible optical power density at the receiver is needed for robust transmission, the optical portion of the preferred embodiments should preferably be selected to achieve a divergence of less than 0.5 mrad, which is to be contrasted with the prior art systems that have divergences in the range of 2.5 mrad. The divergence of less than 0.5 mrad results in an optical density greater than 25 times the optical density of the prior art systems, which, for the same received optical power density corresponds to 5 or more times longer range.

The optical receiver portion of this embodiment should be selected to have an intermediate size, preferably having a diameter in the range of 0.5 millimeter (mm) to 1 centimeter (cm). If the diameter is much smaller than 0.5 mm, it may be difficult to collect enough of the light directed on the receiver. On the other hand, if the diameter is much larger than 1 cm, the responsiveness of the detector may diminish to the point where the performance of the system is compromised.

It should also be understood that more than one Optical Transceiver Unit 324 may be provided in some embodiments, for example to provide multiple wavelengths to transmit information across a single link, in order to increase the bandwidth of a given OWL link. This involves generating light beams having multiple wavelengths and collecting and separating these separate light beams. Numerous apparatus and methods are taught in co-pending patent application Ser. No. 09/836,690, filed Apr. 20, 2001 and incorporated herein by reference.

The Optics 328 are coupled by an optical path 332 to a Position Sensitive Detector ("PSD") 334. The PSD 334 measures the angular deflection of the micro-mirror in two planes. This can be accomplished by detecting the position of a spot of light on a sensor in the PSD 334. The analog signals representing these angular deflections are converted into signals and sent on lines 336 to a Digital Signal Processor ("DSP") 42 for closed loop control of the micro-mirror in Optics 328. PSDs are well known in the art, and PSD 334 may be any of a variety of types, including a single diode Si PSD, CMOS photo-detector array, and the like. All that is required of PSD 334 is that it sense, in two directions, the position of a spot of light impinging thereon, and provide as outputs digital signals representative of such position. However, note that the use of analog control signals is not required in the practice of the present invention. Other known control signal approaches can be used. For example, pulse-width modulation may be used to provide such control. Such choices of control system are well within the purview of those of ordinary skill in this art. A preferable approach to micro-mirror position detection is to employ sensors on the actual micro-mirror itself, as described in greater detail in co-pending and commonly assigned patent applications Ser. Nos. 60/233,851 ("Packaged Mirror with In Package Feedback") and 60/234,081 ("Optical Wireless Networking with Direct Beam Pointing"), which applications are incorporated herein by reference.

In addition to receiving the signal lines 336 from the PSD 334, the DSP 42 sends coil control signals on lines 340 to a set of coil digital to analog converters ("D/As") 342. The D/As 342 are, in turn, connected by way of lines 344 to a corresponding set of coils in Optics 328. Finally, the DSP 42 is connected via line 352 to send and receive OAM data to/from Encoder/Decoder 320. The DSP 42 operates as a link control. It controls the micro-mirror deflections by controlling the coil currents through the D/As 342. Information on the instantaneous micro-mirror deflections is received from the PSD 334 for optional closed loop control. The DSP 42 also exchanges information to the second OWL to orient the beam steering micro-mirror in the proper direction for the link to be established and maintained. The DSP may also exchange OAM information with the second OWL across the optical link maintained by Optical Module 328. DSP 42 may be any suitable DSP, of which many are commercially available. Preferably, the DSP is the DSP provided for by control logic 26, as discussed above, although a second distinct DSP could optionally be used. In addition, note that a single processor may control multiple OWL links. This capability can be very valuable for use in a network hub, where multiple links originate or terminate in a single physical network switch. A single DSP could provide a very cost efficient control facility in such cases. In all such cases, the requirements for this processor are a sufficiently high instruction processing rate in order to control the specified number of micro-mirrors, and a sufficient number of input/output ("I/O") ports to manage control subsystem devices and peripheral functions.

As will be apparent from the above description, the preferred embodiments provide several advantageous features including the ability for two optical wireless links to align themselves to each other without user intervention, quickly and reliably. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of aligning two optical wireless links, each optical wireless link having a light beam having a field of view, comprising:

sweeping the first light beam of the first optical wireless link through a first pre-defined pattern;

sweeping the second light beam of the second optical wireless link through a second pre-defined pattern;

wherein the first light beam transmits position data for the first light beam and the second light beam transmits position data for the second light beam;

detecting the second light beam at the first optical wireless device;

transmitting on the first light beam the position data for the second light beam;

detecting the first light beam at the second optical wireless device; and transmitting on the second light beam, the position data for the first light beam, wherein the position data for the first light beam is updated periodically at a first rate and wherein the position data is transmitted periodically at a faster rate.

2. The method of claim 1 wherein said first and second pre-defined patterns are spiral patterns.

3. The method of claim 1 wherein the position data for the first and second light beams comprises x and y coordinates for the light beam position.

4. The method of claim 1 wherein the position data for the first and second light beams comprises radius and angle coordinates for the light beam position.

5. The method of claim 1 wherein the position data for the first and second light beams comprises a time stamp from which a previous X and y coordinate is calculated.

6. The method of claim 1 wherein the position data for the first and second light beams comprises values in a control packet.

7. The method of claim 1 wherein the transmitting steps comprise modulating a light beam to convey information.

8. The method of claim 1 further comprising:
aligning the first light beam to the position data detected in the second light beam;
and aligning the second light beam to the position data detected in the first light beam.

9. The method of claim 1 wherein the first light beam transmits a default value for position data for the second light beam prior to the step of detecting the second light beam at the first optical wireless device.

10. An optical wireless link comprising:
a light beam transmitter configured to transmit a first light beam;
a light beam steering device, the light beam steering device configured to steer the light beam in a pre-defined pattern during an alignment acquisition phase;
a light beam modulator, configured to modulate the first light beam with light beam position information;
a photodetector configured to receive a second modulated light beam containing alignment feedback information;
wherein the light beam steering device aligns the modulated light beam to a position indicated by the alignment feedback information; and
wherein the light beam modulator is configured to modulate the first light beam with a portion of the alignment feedback information subsequent to the photodetector receiving the second modulated light beam.

11. The optical wireless link of claim 10 wherein the portion of the alignment feedback information is second light beam position information received from a second optical wireless link.

12. The optical wireless link of claim 10 wherein the light beam steering device is a micro-mirror.

13. The optical wireless link of claim 10 further comprising:
control circuitry configured to encapsulate the light beam position information in a network protocol packet.

14. The optical wireless link of claim 10 wherein the pre-defined pattern is a expanding spiral.

15. The optical wireless link of claim 10 wherein the light beam position information includes x and y coordinates for the light beam steering device.

16. The method of claim 10 wherein the position data for the first and second light beams comprises radius and angle coordinates for the light beam position.

17. The method of claim 10 wherein the position data for the first and second light beams comprises a time stamp from which a previous X and y coordinate can be calculated.

18. The optical wireless link of claim 10 wherein the light beam position information includes a sample number.

19. A method of communicating between two data devices comprising:
coupling a first data device to a first optical wireless link;
coupling a second data device to a second optical wireless link;
aligning the first and second optical wireless links, the aligning step including:
modulating a first light beam with first position information and sweeping the first light beam through a pre-defined acquisition pattern;
modulating a second light beam with second position information and sweeping the second light beam through a pre-defined acquisition pattern;
detecting the second light beam at the first optical wireless device; detecting the first light beam at the second optical wireless device;
echoing the second position information back to the second optical wireless device via the first light beam;
echoing the first position information back to the first optical wireless device via the second light beam;
aligning the first light beam to a position indicated by the second echoing step;
and aligning the first light beam to a position indicated by the second echoing step; and communicating data between the first and second data devices over the first and second light beams, subsequent to the aligning step, wherein the first and second position information is transmitted periodically on said first and second light beams, respectively and the rate of transmission is greater than the rate at which the position information is updated.

20. The method of claim 19 further comprising:
transmitting data from the first data device in an electrical format and converting it to an optical format prior to the communicating step.

21. The method of claim 19 further comprising sweeping the first and second light beams through a second pre-defined acquisition pattern after the steps of aligning the first light beam and aligning the second light beam, respectively.

22. The method of claim 19 further comprising:
periodically sensing the position of the first light beam and the position of the second light beam and updating the first position information and second information, respectively.

23. The method of claim 19 wherein at least one of said first and second data devices is a computer.

24. The method of claim 19 wherein at least one of said first and second data devices is a network.

25. The method of claim 19 wherein at least one of said first and second optical wireless links is a modem.

26. The method of claim 19 wherein said pre-defined acquisition pattern is an over-lapping spiral.

* * * * *